(12) United States Patent
Ishikawa

(10) Patent No.: US 6,203,658 B1
(45) Date of Patent: Mar. 20, 2001

(54) PROCESSING SYSTEM AND METHOD FOR MAKING SPHERICAL SHAPED SEMICONDUCTOR INTEGRATED CIRCUITS

(75) Inventor: Akira Ishikawa, Dallas, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/265,235

(22) Filed: Mar. 8, 1999

Related U.S. Application Data

(62) Division of application No. 09/086,872, filed on May 29, 1998, now Pat. No. 6,004,396, which is a division of application No. 08/858,004, filed on May 16, 1997, now Pat. No. 5,955,776.
(60) Provisional application No. 60/032,340, filed on Dec. 4, 1996.

(51) Int. Cl.⁷ .................................................. H01L 21/00
(52) U.S. Cl. ............................................ 156/345; 451/178
(58) Field of Search ............................... 156/345; 134/26; 451/178

(56) References Cited

U.S. PATENT DOCUMENTS

| | | | |
|---|---|---|---|
| 5,462,639 | * | 10/1995 | Matthews et al. .................... 438/745 |
| 5,868,862 | * | 2/1999 | Douglas et al. ......................... 134/26 |

\* cited by examiner

*Primary Examiner*—Thi Dang
(74) *Attorney, Agent, or Firm*—Haynes and Boone, LLP

(57) ABSTRACT

A spherical shaped semiconductor integrated circuit ("ball") and a system and method for manufacturing same. The ball replaces the function of the flat, conventional chip. The physical dimensions of the ball allow it to adapt to many different manufacturing processes which otherwise could not be used. Furthermore, the assembly and mounting of the ball may facilitates efficient use of the semiconductor as well as circuit board space.

1 Claim, 15 Drawing Sheets

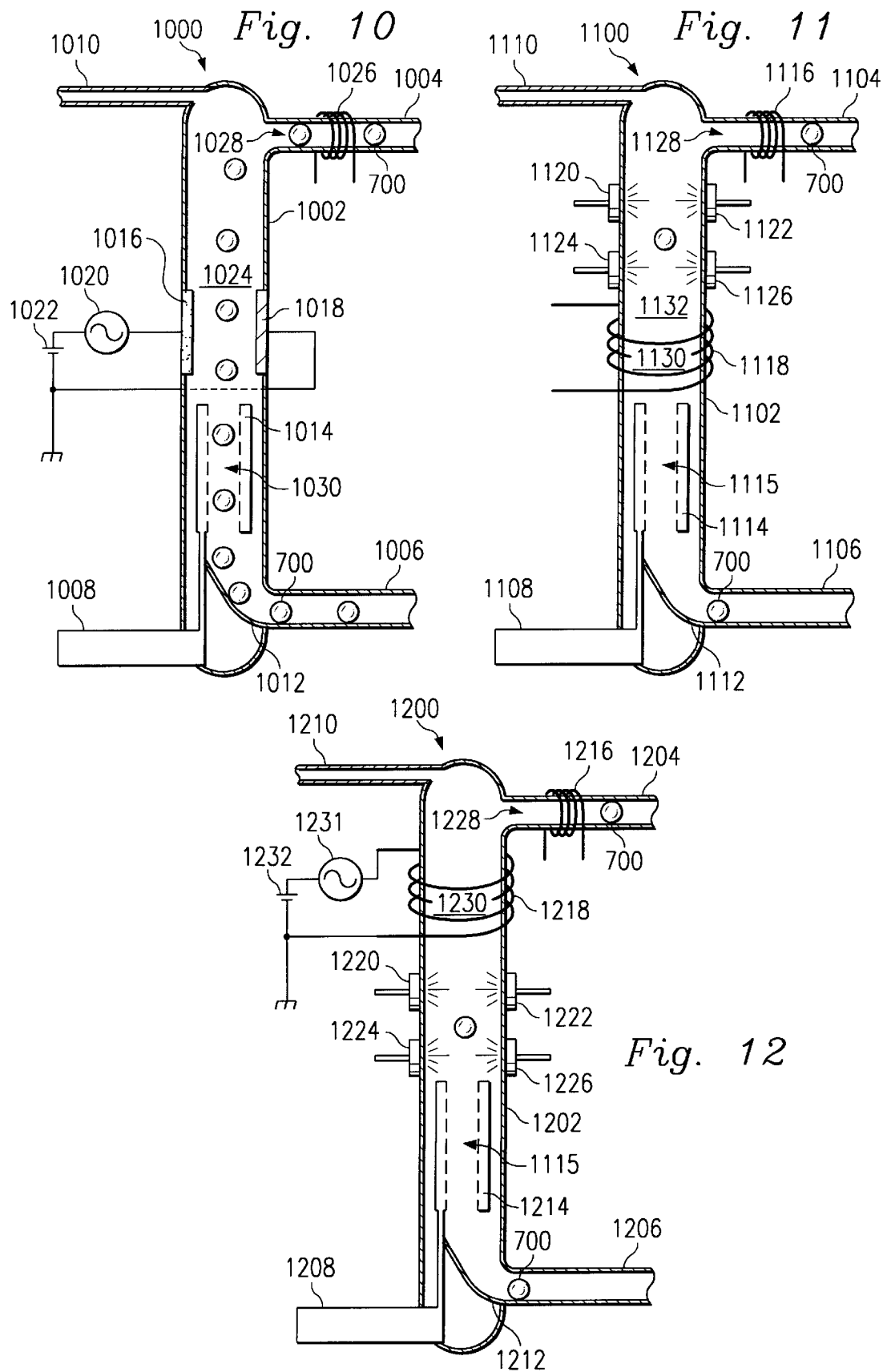

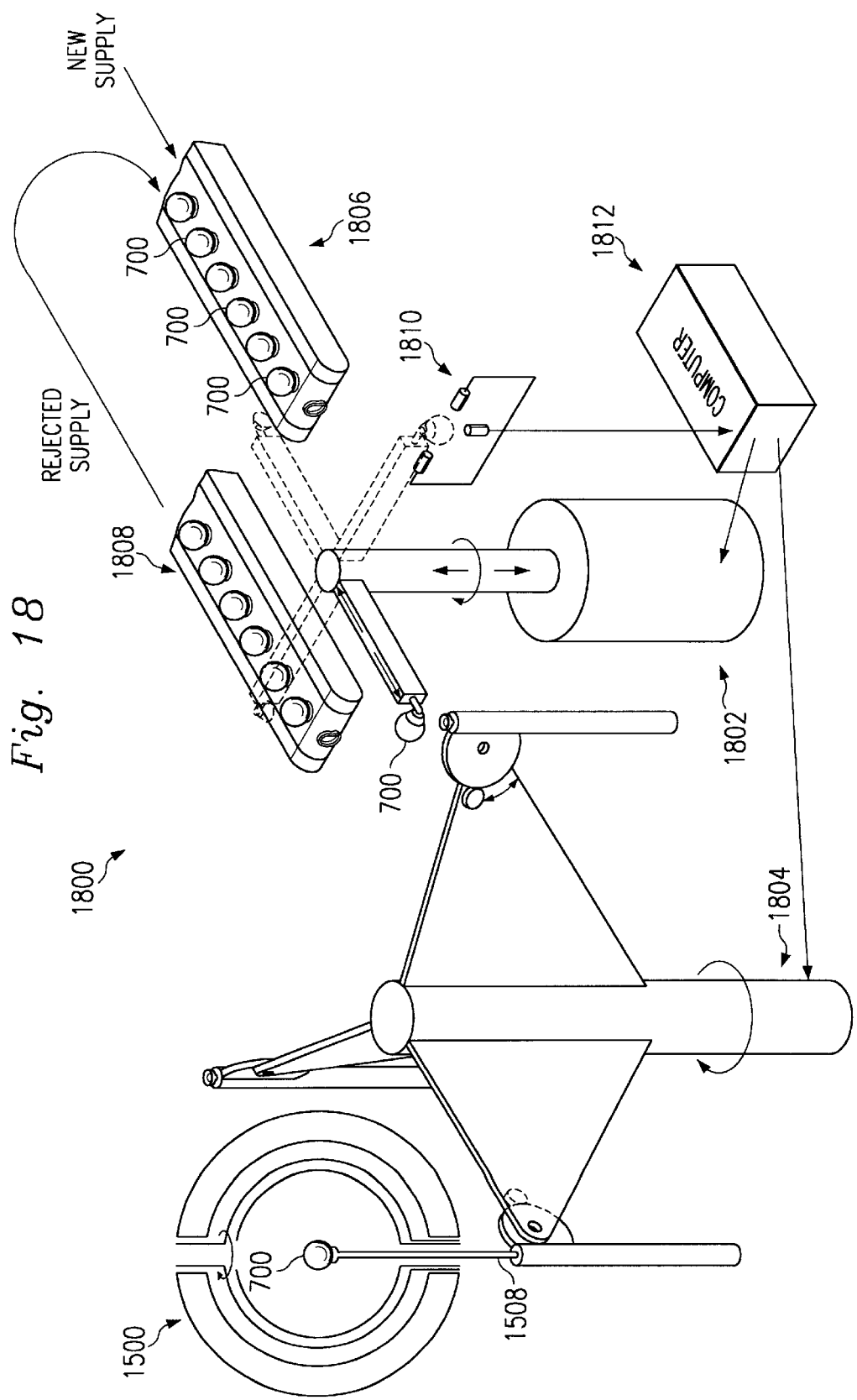

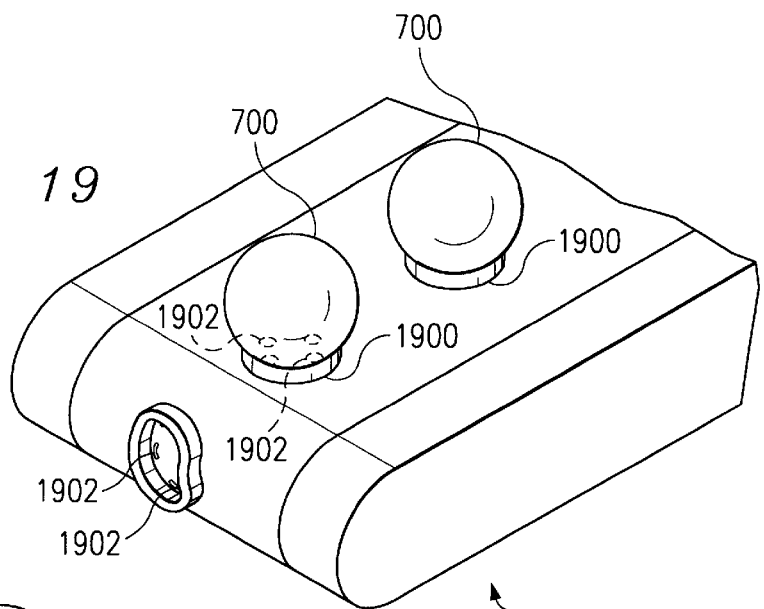
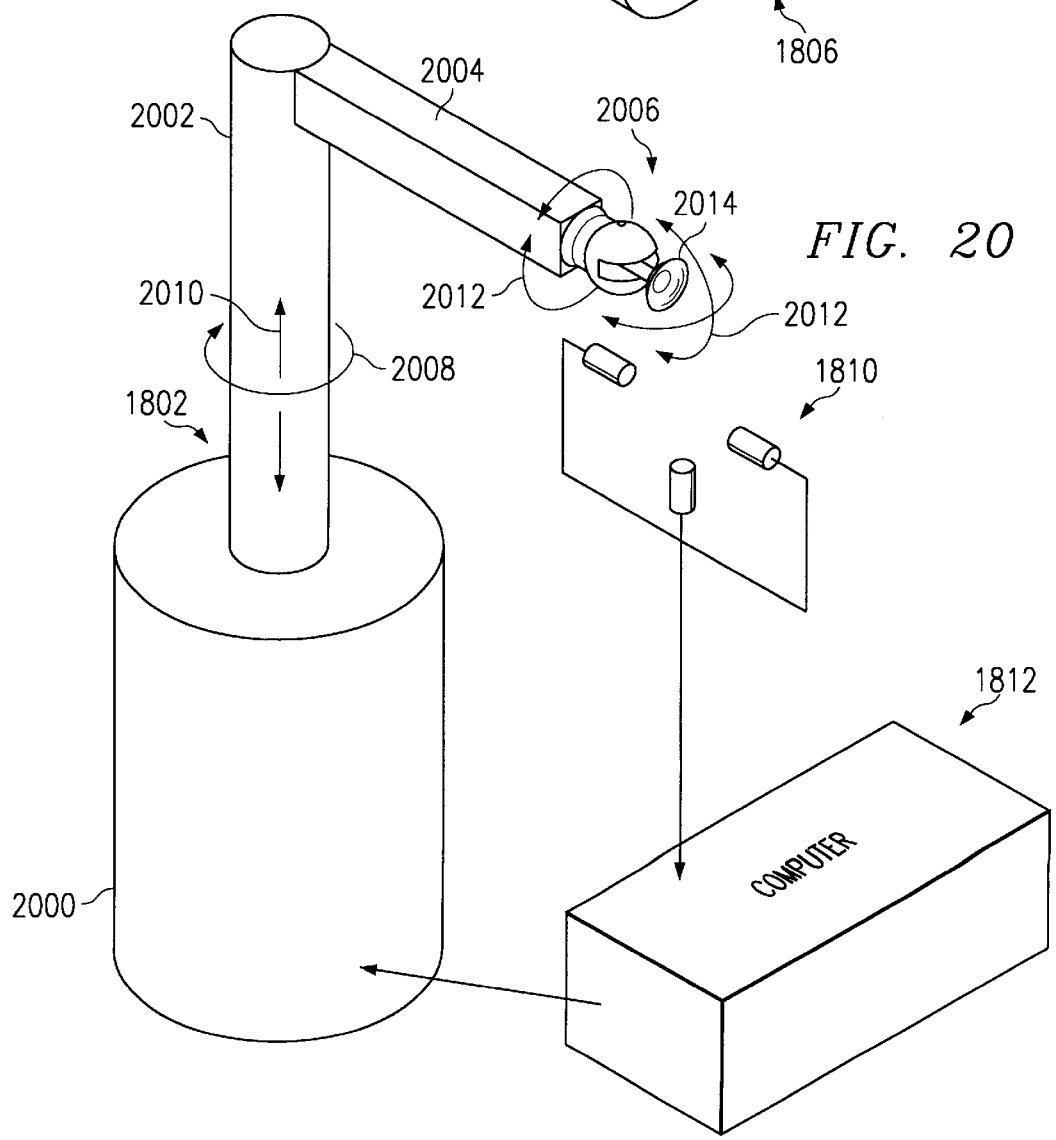

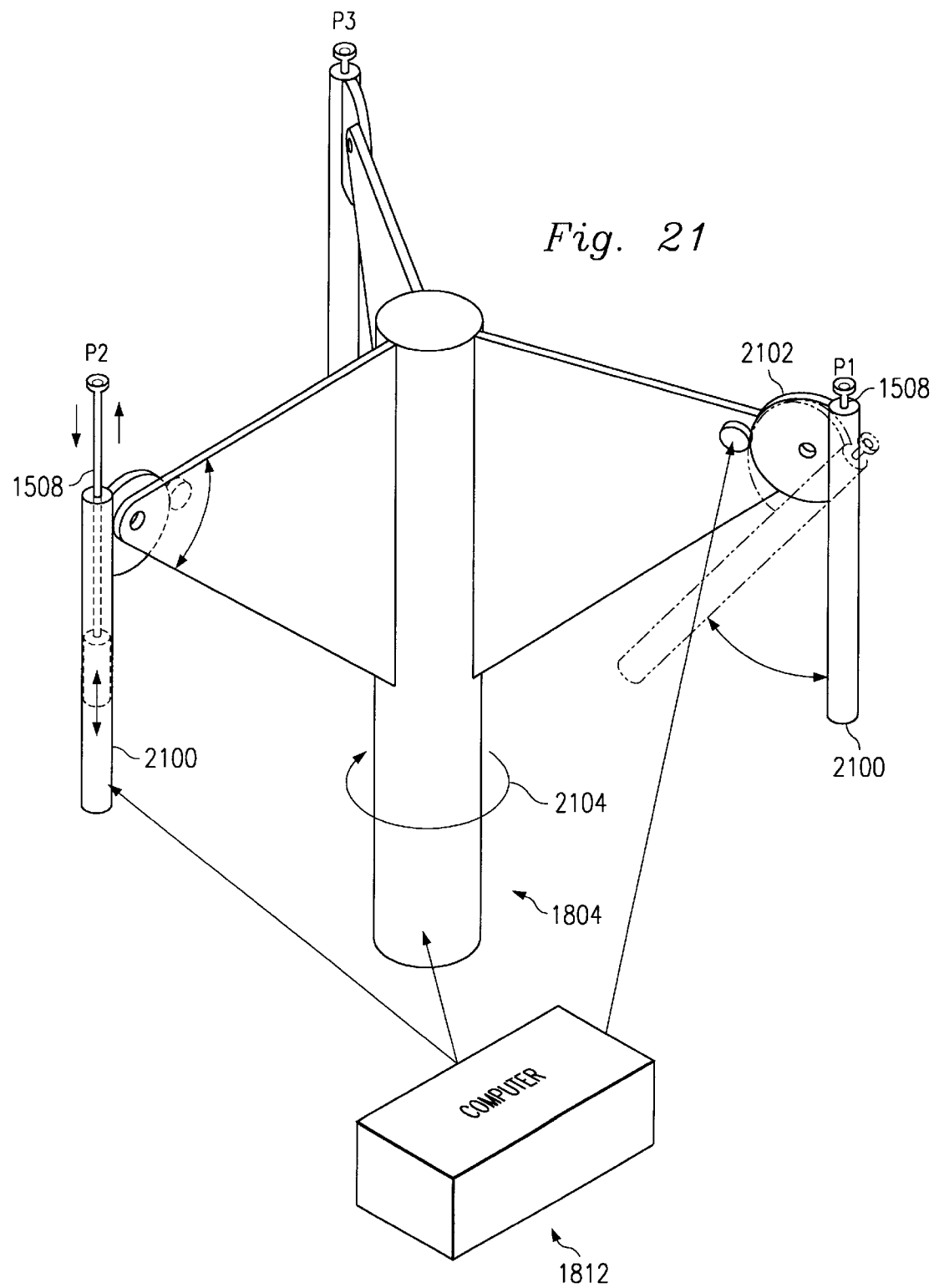

PROCESSING SYSTEM AND METHOD FOR MAKING SPHERICAL SHAPED SEMICONDUCTOR INTEGRATED CIRCUITS

CROSS REFERENCE

This is a divisional of application Ser. No. 09/086,872, filed May 29, 1998, now U.S. Pat. No. 6,004,396 which is a divisional of application Ser. No. 08/858,004, filed May 16, 1997, now U.S. Pat. No. 5,955,776 which claims priority from provisional application Ser. No. 60/032,340, filed Dec. 4, 1996, now abandoned.

BACKGROUND OF THE INVENTION

The invention relates generally to semiconductor integrated circuits, and more particularly, to a spherical shaped semiconductor integrated circuit and a system and method for manufacturing same.

Conventional integrated circuits, or "chips", are formed from a flat surface semiconductor wafer. The semiconductor wafer is first manufactured in a semiconductor material manufacturing facility and is then provided to a fabrication facility, or "fab." At the fab, several layers are processed onto the semiconductor wafer surface. Once completed, the wafer is then cut into one or more chips and assembled into packages. Although the processed chip includes several layers fabricated thereon, the chip still remains relatively flat.

To own and operate a modern wafer manufacturing facility, fab, and assembly facility, tremendous resources must be assembled. For example, a single fab typically cost several billion dollars, and therefore requires a great deal of capital and commitment. This high level of capital and commitment is compounded by many problems inherent to both chips and fabs.

Many of these problems reflect on the enormous effort and expense required for creating silicon wafers and chips. For example, manufacturing the wafers requires creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above process typically have many-defects. These defects can be attributed to the difficulty in making a single, highly pure crystal due to the cutting, grinding and cleaning processes as well as impurities associated with containers used in forming the crystals. For example, oxygen is a pronounced impurity associated with the quartz crucible. These defects become more and more prevalent as the integrated circuits formed on these wafers contain smaller and smaller dimensions.

A problem associated with modern fabs is that they require many different large and expensive facilities. For example, fabs require dust-free clean rooms and temperature-controlled manufacturing and storage areas to prevent the wafers and chips from defecting and warping. The amount of dust in the clean rooms is directly proportional to the end quality of the chips. Also, warping is especially problematic during heat treatment processes.

Other problems associated with modern fabs result from their inherently inefficient throughput as well as their inefficient use of silicon. For example, modern fabs using in-batch manufacturing, where the wafers are processed by lots, must maintain huge inventories to efficiently utilize all the equipment of the fab. Also, because the wafers are round, and completed chips are rectangular, the peripheral portion of each wafer cannot be used.

Still another problem associated with modern fabs is that they do not produce chips that are ready to use. Instead, there are many additional steps that must be completed, including: cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional chips. Furthermore, the chips must bear a high price to cover the costs of manufacturing, as well as the return on initial capital and investment.

SUMMARY OF THE INVENTION

The present invention, accordingly, provides a spherical shaped semiconductor integrated circuit and a system and method for manufacturing same. The spherical shaped semiconductor integrated circuit, hereinafter "ball", replaces the function of the flat, conventional chip. The physical dimensions of the ball allow it to adapt to many different manufacturing processes which otherwise could not be used. Furthermore, the assembly and mounting of the ball facilitates efficient use of semiconductor material as well as circuit board space.

An advantage achieved with the present invention is that it supports semiconductor processing using wafting in a vacuum, gas or liquid. Such wafting may be in a vertical, horizontal or diagonal direction.

Another advantage achieved with the present invention is that it supports semiconductor processing while the ball is moving through a pipe, tube, or container. Such movement may be in a vertical, horizontal or diagonal direction. Furthermore, the pipe or tube can be continuous, thereby reducing or eliminating the need for a clean room environment.

Another advantage achieved with the present invention is that it supports semiconductor processing at ultra-high temperatures, including such temperatures at or above conventional semiconductor material warping or melting points.

Another advantage achieved with the present invention is that it facilitates crystal formation in that a spherical crystal is naturally formed by its own surface tension.

Another advantage achieved with the present invention is that the spherical shape of the ball provides much greater surface area on which to inscribe the circuit.

Another advantage achieved with the present invention is that the spherical shape of the ball withstands external forces better than the conventional chip. As a result, conventional assembly packaging is not always required with the ball.

Another advantage achieved with the present invention is that the spherical shape of the ball allows one ball to be connected directly to a circuit board or clustered with another ball. Such clustering enables three-dimensional multi-active layers and multi-metal layers in any direction.

Another advantage achieved with the present invention is that it allows a single, relatively small facility to manufacture the semiconductor material as well as perform the fabrication. Furthermore, the requirements for assembly and packaging facilities are eliminated.

Another advantage achieved with the present invention is that it reduces manufacture cycle time.

Another advantage achieved with the present invention is that a single fabrication structure can be commonly used for many different processing steps.

Other advantages, too numerous to mention, will be well appreciated by those skilled in the art of semiconductor fabrication.

BRIEF DESCRIPTION OF THE DRAWINGS

FIG. 10 is a descending-type treatment device with electrodes for processing the ball.

FIG. 11 is a descending-type treatment device with coating sprayers for processing the ball.

FIG. 12 is a descending-type treatment device with gas sprayers for processing the ball.

FIG. 18 illustrates a second mounting system for used with the first fixed-type photo exposure system of FIG. 15.

FIG. 19 illustrates a conveyor system used with the second mounting system of FIG. 18.

FIG. 20 illustrates a positioner system used with the second mounting system of FIG. 18.

FIG. 21 illustrates a pivotal arm system used with the second mounting system of FIG. 18.

DETAILED DESCRIPTION OF THE INVENTION

Figure 1:
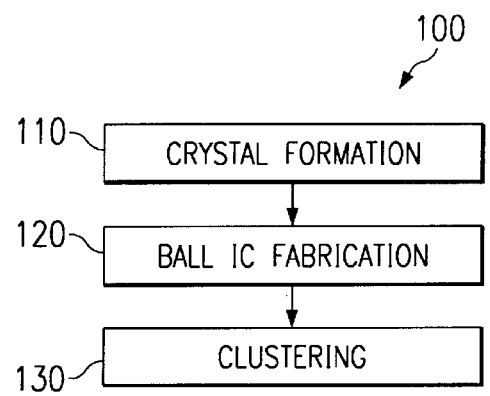
FIG. 1 provides a flow chart for making and using a spherical shaped semiconductor integrated circuit embodying features of the present invention.

Referring to FIG. 1, the reference numeral 100 generally designates a manufacturing system for creating and configuring spherical shaped semiconductor integrated circuits ("balls"). For the remainder of the description, the process will be described with respect to silicon, it being understood that any semiconductive material can be used.

Initially, a crystal formation process 110 forms a single spherical crystal. Upon formation of the spherical crystal, a fabrication process 120 constructs a circuit onto the spherical crystal to form the balls. Once fabricated, a clustering process 130 connects the balls with each other and other devices, such as a printed circuit board.

I. Formation of Granular Polycrystal and a Single Spherical Crystal

Conventionally, there have been three prevalent methods for manufacturing granular polycrystal semiconductor. One method is to crush a polycrystal rod or ingot. Another method utilizes fluid bed reaction by supplying powder form polycrystal to a fluid bed reactor. A third method involves melting semiconductor material in an inert gas and "blowing off" or dropping the melted semiconductor. These three methods have many associated problems. For one, each of the above methods is very labor intensive, especially as the size of the polycrystal increases to support larger and larger diameter wafers. As a result, they are all fairly expensive and result in a relatively poor yield of quality product. In addition, the granules are not uniform in size and weight, particularly with the fluid bed reactor method.

A. A GRANULAR POLYCRYSTAL PROCESSING SYSTEM

Figure 2:
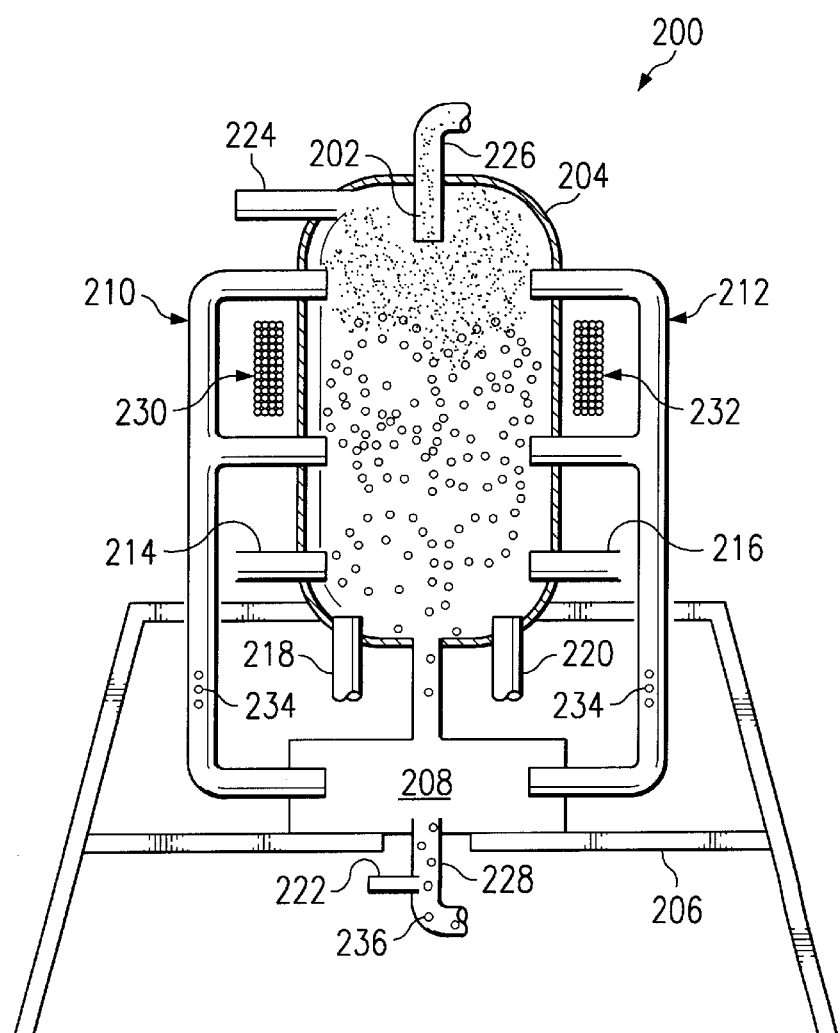
FIG. 2 illustrates a return-type fluid bed repetitive reactor for manufacturing granular semiconductor polycrystal.

Referring to FIG. 2, a return-type repetitive fluid bed reactor furnace 200 grows silicon polycrystalline powder 202 into graular polycrystals. The fluid bed reactor furnace 200 uses a fluid bed reaction process, operating at a high temperature over a very short time, to grow the powder 202 from a crushed silicon ingot or other source. As a result, the fluid bed reactor furnace 200 produces granules that are relatively uniform in size and weight.

The fluid bed reactor furnace 200 contains a furnace compartment 204, a supporting stand 206, a weight sorter 208 and a plurality of pipes including return pipes 210, 212, gas pipes 214, 216, 218, 220, 222, exhaust pipe 224 and material conveyance pipes 226, 228. Attached to the furnace compartment 204 are heaters 230, 232.

In operation, the silicon polycrystalline powder 202, in powder or sand form, enters the furnace compartment 204 through the material conveyance pipe 226. Simultaneously, a gas such as monosilane SiH4 is injected from the bottom of the furnace compartment 204 through gas pipes 218, 220. The powder 202 and the SiH4 mix to form a fluid bed reaction layer inside the furnace compartment 204. The fluid bed reaction layer is heated by heaters 230 and 232.

As the powder 202 is mixing in the furnace compartment 204, it grows in size such that it eventually falls into the weight sorter 208. At the weight sorter 208, rejected granules 234, which are lighter than a predefined weight, are returned to the fluid bed reaction layer through the return pipes 210, 212. However, granules 236 meeting the predefined weight are exported through the material conveyance pipe 228. Also, exhaust gas is discharged through the exhaust pipe 224.

As the granules 236 are exported through the material conveyance pipe 228, a carrier gas (not shown) is injected through the gas pipe 222 to help carry the granules. In addition, by injecting an appropriate amount of impurity to the carrier gas, the silicon of the granules 236 can be doped to become n-type or p-type silicon, as desired. Furthermore, by connecting several fluid bed reactor furnaces 200 in series, the granules 236 can also be manufactured by a repetitive fluid bed reaction process.

B. A SYSTEM FOR MANUFACTURING SMALL GRANULAR SINGLE CRYSTALS

Figure 3:
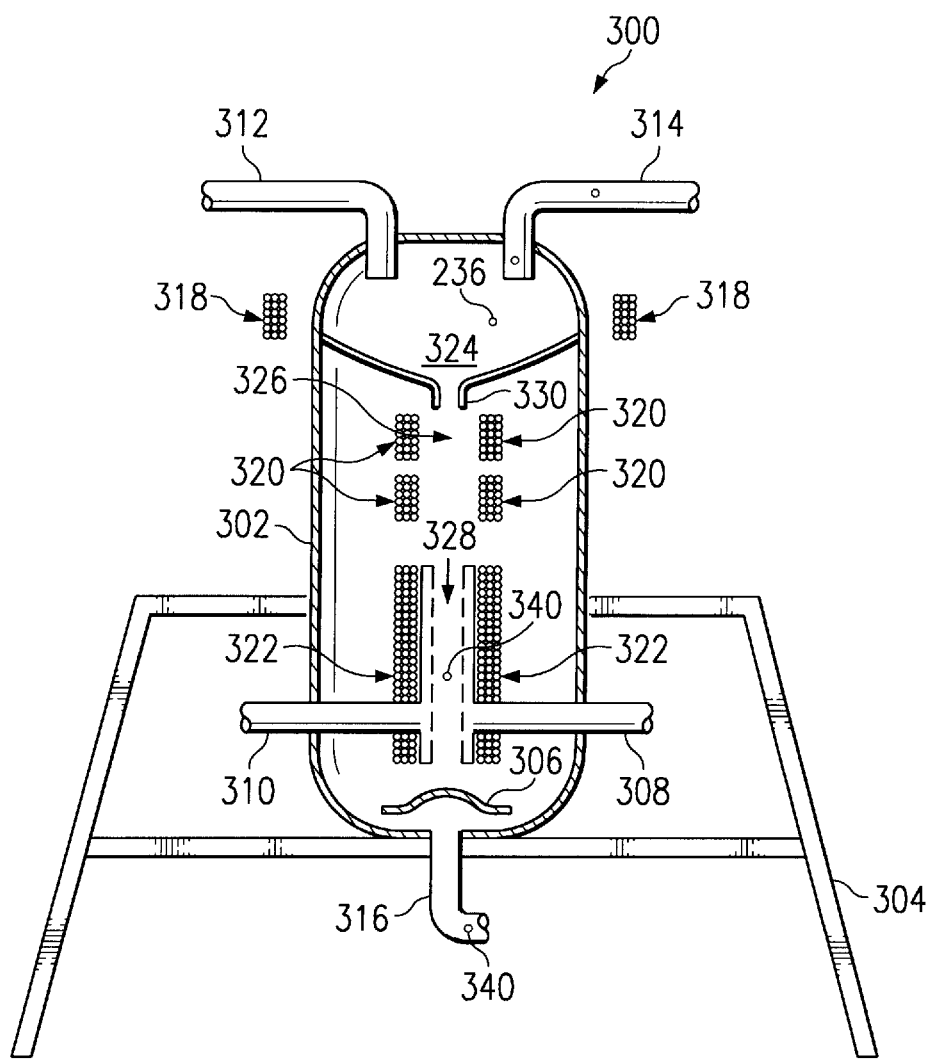
FIG. 3 illustrates a descending-type wafting treatment device used as a granular single crystal furnace for processing the polycrystal of FIG. 2.

Referring to FIG. 3, a descending-type wafting treatment device 300 is used to manufacture a small granular single crystal. The wafting device 300 includes a furnace compartment 302, a supporting stand 304, a landing table 306 and a plurality of pipes including gas pipes 308, 310, an exhaust pipe 312, and material conveyance pipes 314, 316. Attached to the furnace compartment 302 are several pre-heaters 318, ultra-high temperature heaters 320, and low temperature heaters 322, thereby forming a preheat zone 324, an ultra-high temperature zone 326, and a low temperature zone 328, respectively, inside the compartment. The ultra-high temperature zone 326 may alternatively, or additionally, be heated by other methods including high-frequency heating, laser beam heating or plasma heating.

In operation, each of the granules 236 (FIG. 2) enters the wafting device 300 through the material pipe 314. The granules 236 first enter the preheat zone 324, which has a temperature below the melting point of granular polycrystal silicon. The granules 236 then descend through an opening 330 into the ultra-high temperature zone 326, which has a temperature far above the melting point of silicon. The ultra-high temperature zone 326 is filled with inert gas (not shown) containing impurities, which is piped in from gas pipes 308, 310. The impurities carried with the inert gas also allow the granules 236 to be doped n-type or p-type, as required. The granules 236 melt as they descend through the ultra-high temperature zone 326, the rate of descent being controlled by the inert gas flowing through the gas pipes 308, 310.

Because each of the granules 236 have melted, they become spherical in shape due to surface tension, and thereby take the form of a granular single crystal 340. The granular single crystals 340 continue to descend into the low temperature zone 328, where they harden. The low temperature zone 328 is of sufficient air pressure to assist the granular single crystals 340 in making a soft landing on the table 306.

It is understood that the direction of flow through the wafting device 300 is not essential to the formation of the granular single crystals 340. For example, an alternative embodiment is an ascending-type wafting device which propels the granular single crystals upwards by the injected gas. Therefore, for this device, as well as other devices described below, obvious modifications to direction of flow are therefore anticipated.

Figure 4:
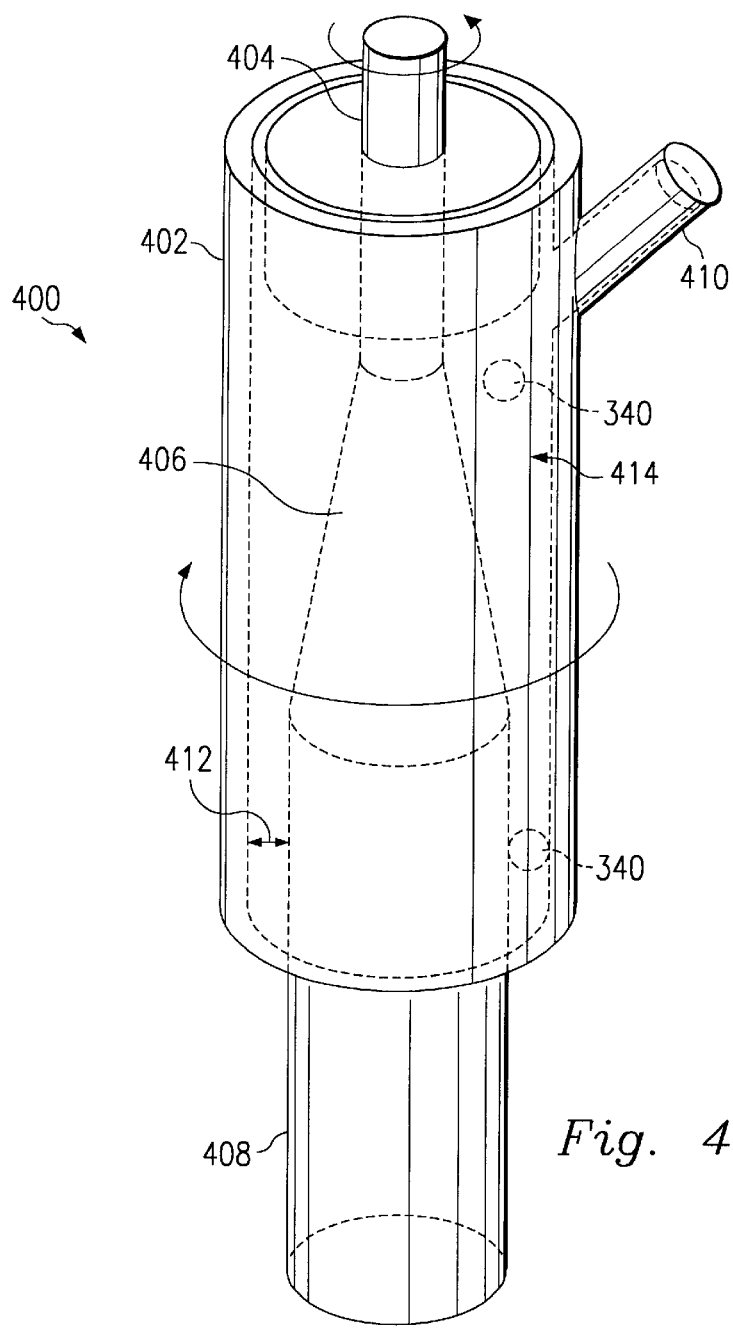
FIG. 4 illustrates a spherical surface polishing system for polishing a spherical semiconductor single crystal.

Referring to FIG. 4, although some of the granular single crystals 340 may already meet required specifications for diameter and roundness, it may be necessary to polish one or more of the granular single crystals 340 using a granular single crystal spherical surface polishing device 400. The polishing device 400 includes an outer pipe 402, an inner pipe 404 having a tapered section 406 and an expanded section 408, and material conveyance pipes including a product inlet pipe 410. A distance 412 between the inner surface of the outer pipe 402 and 1he outer surface of the expanded section 408 defines the final diameter of the granular single crystals 340. The polishing device 400 may be in a vertical, horizontal, or diagonal orientation to facilitate the polishing process.

In operation, the granular single crystals 340 enter the polishing device 400 through the inlet pipe 410 and fall into an area 414 defined by the tapered section 406 and the outer pipe 402. The outer pipe 402 rotates in one direction while the inner pipe 404, including the tapered section 406 and expanded section 408, rotates in the opposite direction. Although not shown, the inlet pipe 410 also allows polishing material such as alumina powder and water to be introduced into the area 414. As a result of the counter rotations of the pipes 402, 404, along with the abrasive affects of the alumina powder and water, the granular single crystal 340 is polished into a spherical shape of a desired diameter.

The polishing device 400, due to the polishing and grinding actions occuring within, creates a large amount of heat. Therefore, to cool the polishing device 400, the pipe 402 includes conduits (not shown) to allow a cooling fluid to flow therethrough. Many other devices described below require cooling, it being understood that cooling fluids and alternative methods of cooling are well understood in the art, and will therefore not be further discussed.

C. SINGLE SPHERICAL CRYSTAL MANUFACTURING

Figure 5B:
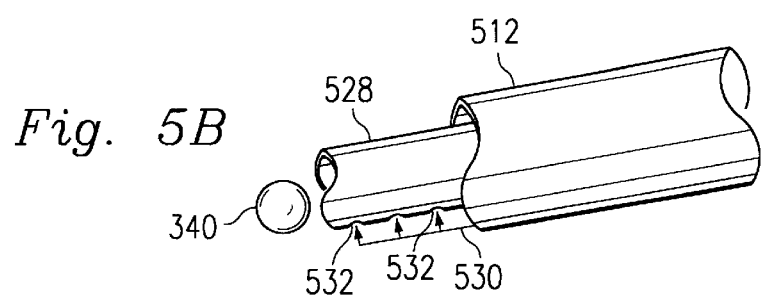
FIG. 5B provides a close-up view of part of the floating-type treatment device of FIG. 5A.
Figure 5A:
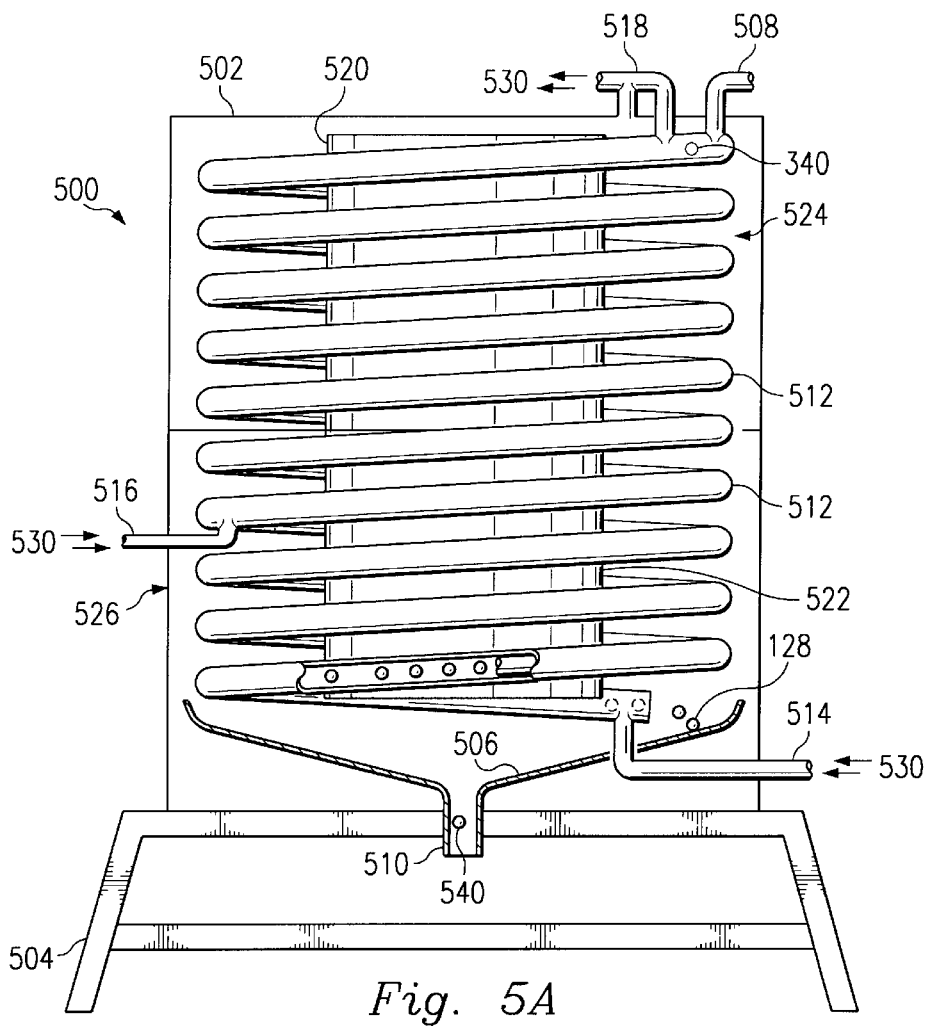
FIG. 5A illustrates a floating-type treatment device for processing the crystal of FIG. 4.

Referring to FIG. 5A, a spiral-type floating treatment device 500 is used to grow a single spherical crystal by epitaxial growth. The spiral device 500 includes a furnace section 502, a support stand 504, a soft-landing table 506, and a plurality of pipes, including material conveyance pipes 508, 510, gas pipes 512, 514, 516, an exhaust pipe 518, and heaters 520, 622. The heaters 520, 522 define zones inside the spiral device 500, including a preheating zone 524 and a high temperature epitaxial growth zone 526, respectively.

Referring also to FIG. 5B, the material conveyance pipe 508 connects to a float pipe 528 which is a continuous, spiral shaped pipe inside and coaxial with the gas pipe 512. The float pipe 528 is spot-welded to the gas pipe 512 so that a liquid can flow between the two. In the present embodiment, the liquid is monosilane gas, mixed with other gases such as argon, hydrogen or helium. For simplicity, the liquid will hereinafter be referred to as a carrier gas 530. The granular single crystal 340 moves through the float pipe 528, while the carrier gas 530 moves through the spiral pipe 512. The carrier gas 530 enters the gas pipe 512, under pressure, through gas inlet pipes 514, 516, and is exhausted through the gas outlet pipe 518. The float pipe 528 includes a plurality of very small gas apertures 532 so that the carrier gas 530 can flow therethrough and support the granular single crystal 340 inside the float pipe 528. As a result, the granular single crystal 340 "floats" on the carrier gas inside the float pipe 528, thereby avoiding direct contact with the float pipe.

In operation, each granular single crystal 340 enters the spiral device 500 through the material conveyance pipe 508, which connects to the float pipe 528. The granular single crystal 340 then begins to travel down the float pipe 528, pulled by gravity and floating on the carrier gas 530. The granular single crystal 340 moves through the preheating zone 524 into the epitaxial growth zone 526.

Upon entering the epitaxial growth zone 526, the granular single crystal 340 begins to epitaxially grow. Impurity concentration and rate of epitaxial growth can be controlled by the temperature of the epitaxial growth zone 526, as well as impurities injected into the gas pipe 512 through the carrier gas 530. Finally, the granular single cresyl 340 has epitaxially grown into a nearly perfect sphere, hereinafter referred to as a crystal sphere 540. The crystal sphere 540 then exits the float pipe 528, lands on the soft-landing table 506, is cooled, and proceeds through the material conveyance pipe 510.

Figure 6:
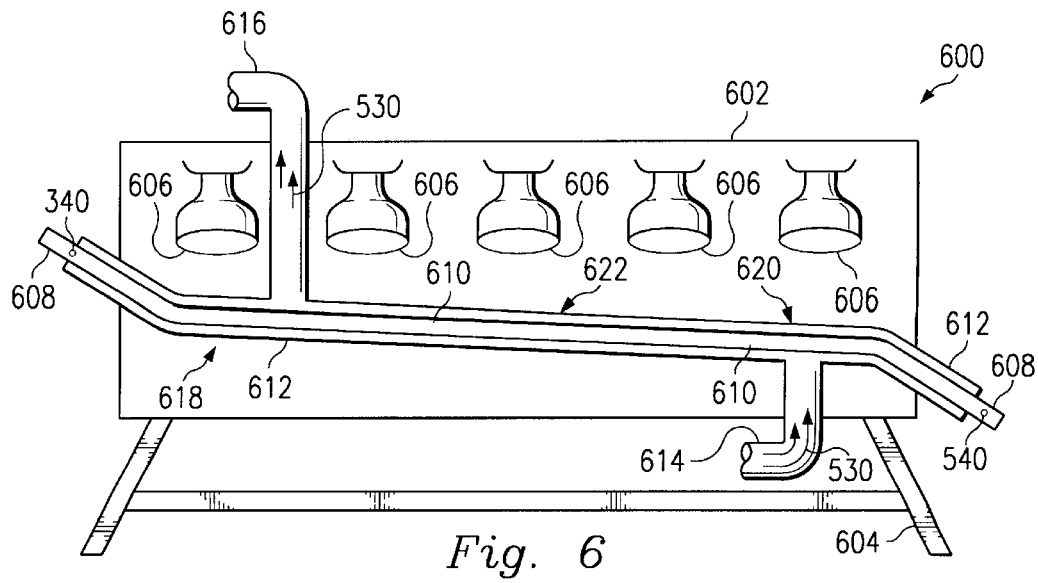
FIG. 6 illustrates a movement-type treatment device for processing the crystal of FIG. 4.

Referring to FIG. 6, a movement-type floating treatment device 600 is another apparatus for epical growing the single spherical crystal 340. The movement device 600 includes a furnace section 602, a support stand 604, heaters 606, and a plurality of pipes, including a material conveyance pipe 608 connected to a float pipe 610, gas pipes 612, 614, and an exhaust pipe 616. The float pipe 610 and gas pipe 612 operate in a manner similar to the float pipe 528 and the gas pipe 512, respectively, of FIG. 5B. Furthermore, the heaters 606 define zones inside the movement device 600, including a preheating zone 618, a cooling zone 620 and a high temperature epitaxial growth zone 622.

In operation, the granular single crystal 340 enters the movement device 600 through the material conveyance pipe 608. The granular single crystal 340 then begins to travel down the material conveyance pipe 608, being pulled by gravity and floating on the carrier gas 530 from gas pipe 614. The granular single crystal 340 moves through the preheating zone 618 into the epitaxial growth zone 622.

Upon entering the epitaxial growth zone 622, the granular single crystal 340 begins to epitaxially grow. Impurity concentration and the rate of epitaxial growth can be controlled by the temperature of the epitaxial growth zone 622, the angle of the material conveyance pipe 608, and the impurities injected into the gas pipe 612 through the carrier gas 530. Finally, the granular single crystal 340 has epitaxially grown into the crystal sphere 540, similar to that of FIG. 5. The crystal sphere 540 then exits the movement device 600 through the material conveyance pipe 608.

Because the crystal sphere 540, and all of its predecessors, are small, light and round, the entire manufacturing process described above can be easily automated. For example, inlet product pipes of one device can be mated with outlet product pipes of a predecessor device. Therefore, because the entire process can be formed out of continuous pipes, the introduction of contaminants is greatly reduced.

II. Fabrication of the Ball

Fundamentally, fabrication of a ball includes the same basic processing steps used by conventional chip or wafer fabrication. Wafer fabrication is implemented by exposing mask patterns to the surface of the semiconductor wafer and implementing processing or treatment operations to the wafer surface. The processing or treatment operations can be further described as: de-ionized water cleaning, developing and wet etching; diffusion, oxidation and deposition of films; coating; exposure; plasma etching, sputtering and ion implantation; ashing; and epitaxial growth.

The fabrication equipment described below may facilitate several different methods and each of the methods can be used to perform different processing operations. For example, a wafting processing treatment method can be used for cleaning, drying, or making films on the crystal spheres 540 as they travel therethrough, examples of which are described below.

Therefore, the fabrication processes and equipment described below are not listed in any particular sequence. Also, it is understood that many of the processes will be repeated. Further still, the processes described below are not intended to be exclusive of all the fabrication processes, but are intended to illustrate sample processes to provide a clear understanding of the invention. Because the sequence and repetition of the processes may be different, the crystal sphere 540 will, for the following discussion and following figures relating to fabrication, be referred to as a ball 700, even though it goes through many changes during fabrication.

A. CLEANING PROCESS

Conventional wafer processing cleans wafers by fixing a lot of wafers onto a wafer boat and dipping both into large reservoirs of de-ionized water. Many problems are associated with this method. For one, the time and cost of replacing the de-ionized water with fresh water is significant. Further, the entire process requires large and expensive reservoirs.

Figure 7:
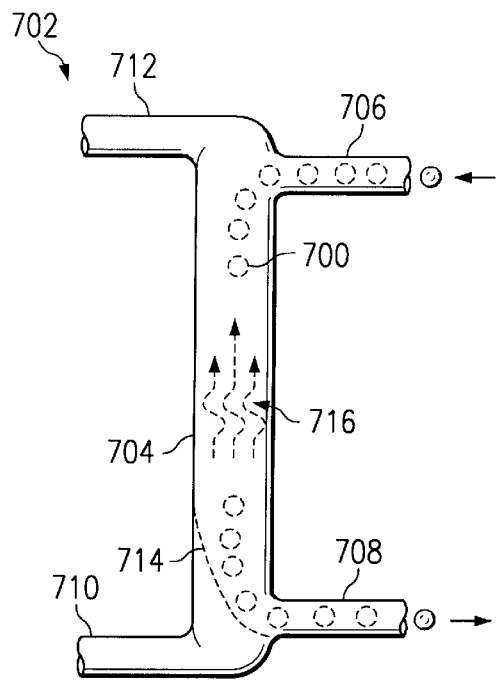
FIG. 7 illustrates a descending-type treatment device for processing the ball.

Referring to FIG. 7, a descending-type wafting device 702 performs a cleaning process on the ball 700. The wafting device 702 includes a processing pipe 704 with a product inlet 706, a product outlet 708, a de-ionized water inlet 710, a de-ionized water outlet 712, and a product guide 714.

In operation, the ball 700 enters the product inlet 706 and begins to descend towards the product outlet 708. The rate of descent is affected by the de-ionized water 716 flowing through the processing pipe 704 and gravitational pull on the ball. The de-ionized water 716 is flowing in a direction opposite to that of the descending ball 700. Before the product guide 714 directs the ball 700 to the product outlet 708, the "freshest" de-ionized water is being used to clean the ball.

Figure 8:
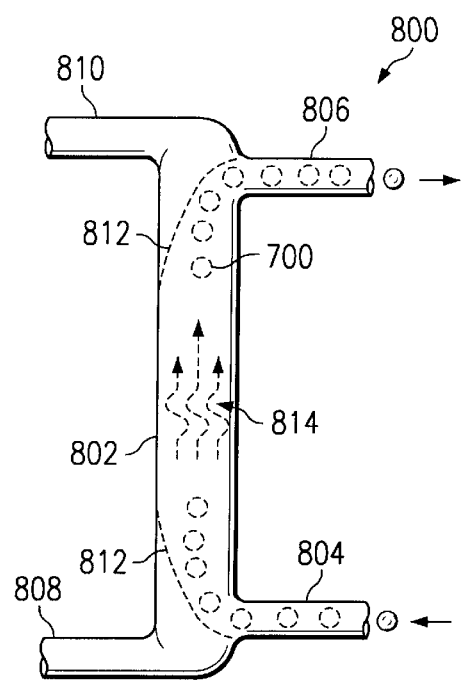
FIG. 8 illustrates an ascending-type treatment device for processing the ball.

Referring to FIG. 8, an ascending-type wafting device 800 may also be used to clean the ball 700. The wafting device 800 includes a processing pipe 802 with a product inlet 804, a product outlet 806, a de-ionized water inlet 808, a de-ionized water, outlet 810, and a product guide 812.

In operation, the ball 700 enters the product inlet 804 and begins to ascend towards the product outlet 806. The rate of ascension is affected by the de-ionized water 814 flowing through the processing pipe 802 and gravitational pull on the ball; the flow rate of the de-ionized water being greater than that of the ball. The de-ionized water 814 is flowing in the same direction as the ascending ball 700. The product guide 812 directs the ball 700 from the product inlet 804 to the product outlet 806.

As a result, both the ascending-type and descending-type wafting devices 800, 702 clean the ball 700 without the use of conventional de-ionized water tanks, support a steady flow of balls, and are relatively small in size. In addition, the ball 700 remains in a hermetically sealed environment, and therefore is less likely to become contaminated. Furthermore, the ascending-type and descending-type wafting devices 800, 702 can be combined, such as by the connecting product outlet 806 to the product inlet 706, to better facilitate cleaning. Such combination of devices can be similarly implemented in the remaining process steps to better facilitate the respective process.

B. WET-ETCHING

Conventional wet etching is similar to conventional cleaning processes, and has similar problems. For one, wet etching typically requires large tanks of chemicals for performing the etching process. In addition, once wafers have been removed from the tanks, the wafers are suspect to contamination by being exposed to surrounding air. In contrast, the two above described wafting devices (FIGS. 7, 8) may also be used for the wet etching process. The operation of the wafting devices is the same as described with reference to. FIGS. 7, 8, except instead of de-ionized water, etching chemical is used. As a result, the wet etching process enjoys the same benefits as described above with the cleaning process.

C. DIFFUSION

Conventionally, the maximum temperature for diffusion of impurities into a wafer is limited to about 1200° C. because of the tendency of the wafer to warp. As a result, impurity diffusion takes tens of hours to complete. In contrast, because of the spherical shape of the ball 700, warpage is less of a concern, the diffusion temperature can be significantly higher and the processing speed becomes much quicker.

Figure 9:
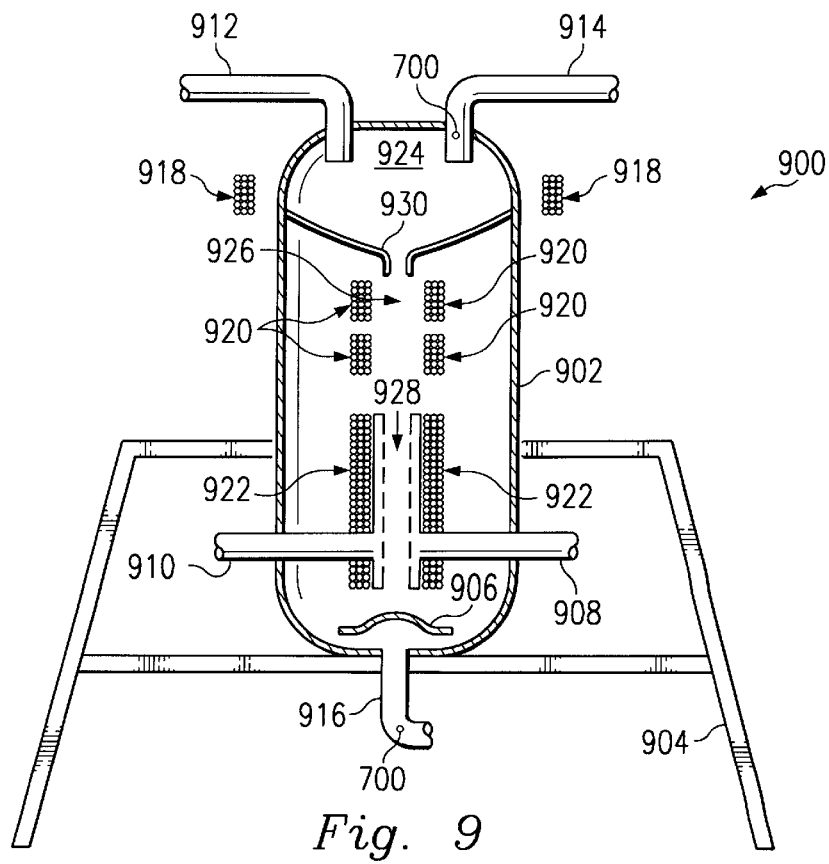
FIG. 9 illustrates a descending-type wafting treatment device used as a diffusion furnace for processing the ball.

Referring to FIG. 9, a descending-type diffusion furnace 900 performs a diffusion process on the ball 700. The diffusion furnace 900 includes a furnace compartment 902, a supporting stand 904, a landing table 906 and a plurality of pipes including gas pipes 908, 910, an exhaust pipe 912, and material conveyance pipes 914, 916. Attached to the furnace compartment 902 are pre-heaters 918, ultra-high temperature heaters 920, and low temperature heaters 922, thereby forming a preheat zone 924, an ultra-high temperature zone 926, and a low temperature zone 928, respectively. The ultra-high temperature zone 920 may alternatively, or additionally, be heated by other methods including high-frequency heating, laser beam heating or plasma heating.

In operation, the ball 700 enters the diffusion furnace 900 through the product inlet pipe 914. The ball 700 first moves through the preheat zone 924, which has a temperature below the melting point of silicon. The ball 700 then descends through an opening 930 into the ultra-high temperature zone 926, which has a temperature far above the melting point of silicon. The ultra-high temperature zone 926 is filled with gas (not shown) containing impurities which is piped in from gas pipes 908, 910. As the ball 700 passes through the ultra-high temperature zone 926, it diffuses instantly by having its surface melt and diffuse with the impurities in the gas. The gas also reduces the rate of descent of the falling ball 700. The ball 700 then enters the low temperature zone 928 where its surface re-crystallizes and the rate of descent is greatly reduced until it lands on the table 906.

D. OXIDATION

Conventional oxidation of silicon wafers has several problems. For one, oxidation is typically done to many wafers at a time. As a result, the oxidation film from wafer to wafer, as well as the film on each wafer, is subject to variability. In addition, oxidation takes a long time due to the warping tendencies discussed above with reference to diffusion. In contrast, the above described diffusion furnace 900 (FIG. 9) may also be used to perform the oxidation process. The operation for oxidation is the same as for diffusion, except instead of impurity laden gas, oxygen is used. As a result, the oxidation process enjoys the same benefits as described above with reference to the diffusion process. In addition, the ball 700 remains in a hermetically sealed environment, and therefore is less likely to become contaminated.

E. SPUTTERING, DEPOSITION AND DRY ETCHING

Referring to FIG. 10, a descending-type plasma device 1000 performs a process for sputtering of metals, deposition of various films, and a dry etching, collectively referred to as a plasma process, on the ball 700. The plasma device 1000 includes a processing pipe 1002 with a product inlet 1004, a product outlet 1006, a gas inlet 1008, and a gas outlet 1010. The gas inlet 1008 forms a product guide 1012 and a product soft-landing pipe 1014 having a plurality of apertures for gas (not shown) to flow through. The plasma device 1000 also includes positive and negative electrodes 1016, 1018, respectively, a radio frequency ("RF") power supply 1020 and a main power supply 1022. The electrodes 1016, 1018 line the interior of the pipe 1002 and thereby form an plasma zone 1024. It is understood, however, that the electrodes 1016, 1018 may also represent metal plates or radio-frequency coils placed on the exterior of the pipe 1002. Furthermore, the plasma device 1000 includes a preheater 1026 which defines a preheat zone 1028.

In operation, the ball 700 enters the product inlet 1004 and begins to descend towards the product outlet 1006. The ball 700 first enters the preheat zone 1028. The ball then descends into the plasma zone 1024 and is processed and treated as it moves therethrough. Gas is injected from the pipe 1008 through apertures 1030 for processing the ball 700 and for controlling the ball's rate of descent. It is understood that different gases, RF frequency, and power are utilized for different processes in a manner well understood in the art.

F. COATING

Coating is used for several processes. For one, coating is used for applying photo resist. Also, coating is used to apply a colored paint for protecting and labeling the finished ball.

Referring to FIG. 11, a descending-type coating device 1100 performs a coating process on the ball 700. The coating device 1100 includes a processing pipe 1102 with a product inlet 1104, a product outlet 1106, a gas inlet 1108, and a gas outlet 1110. The gas inlet 1108 also forms a product guide 1112 and a product soft-landing pipe 1114 having a plurality of apertures 1115 for gas to flow through. The coating device 1100 also includes preheater coils 1116, heater coils 1118, and sprayers 1120, 1122, 1124, 1126. The coils 1116, 1118 line the exterior of the pipe 1102 and thereby form a preheat zone 1128 and a drying zone 1130, respectively. The sprayers 1120, 1122, 1124, 1126 are accessible to the interior of the pipe 1102 and thereby form a coating zone 1132.

In operation, the ball 700 enters the product inlet 1104 and begins to descend towards the product outlet 1106. The ball 700 first enters the preheat zone 1128. The ball 700 then descends into the coating zone 1132. The sprayers eject a fine haze of coating material on the ball 700. The ball 700 then enters the drying zone 1130. Gas, injected through the pipe 1108, facilitates drying as well as controls the rate of descent of the ball 700. The ball then enters the soft-landing pipe 1114 where the apertures 1115 direct the gas against the ball. Furthermore, the gas forces the haze of coating material back up towards the exhaust pipe 1110. The gas from the apertures 1134 can also spin the ball 700 to better facilitate coating and drying.

Referring to FIG. 12, a descending-type gas-coating device 1200 also performs a coating process on the ball 700. The coating device 1200 includes a processing pipe 1202 with a product inlet 1204, a product outlet 1206, a gas inlet 1208, and a gas outlet 1210. The gas inlet 1208 also forms a product guide 1212 and a product soft-landing pipe 1214 having a plurality of apertures 1215 for gas to flow through. The coating device 1200 also includes preheater coils 1216, heater coils 1218, and gas sprayers 1220, 1222, 1224, 1226. The coils 1216, 1218 line the exterior of the pipe 1202 and thereby form a preheat zone 1228 and a drying zone 1230, respectively. The gas sprayers 1220, 1222, 1224, 1226 are accessible to the interior of the pipe 1202 and thereby form a polymerization zone 1232. The coating device 1200 also includes a RF power supply 1230 and a main power supply 1232.

In operation, the ball 700 enters the product inlet 1204 and begins to descend towards the product outlet 1206. The ball 700 first enters the preheat zone 1228. The ball 700 then descends into the polymerization zone 1232. The sprayers 1220 and 1226 eject a first monomer gas and the sprayers 1222 and 1224 eject a second monomer gas. The first and second monomer gases combine to form a photo sensitive polymer gas such as poly-methyl-meta-acrylate (not shown). Reaction in the polymerization zone 1232 is facilitated by the heating energy from the RF power supply 1230 and the main power supply 1232. As a result, a very thin photosensitive film can be attained on the ball 700 without using any liquid-form photo resist. The ball 700 then enters the soft-landing pipe 1214 where the apertures 1215 direct inert gas against the ball. The inert gas also forces the polymer gas up towards the exhaust pipe 1210.

G. PHOTO EXPOSURE

Conventionally, wafers are placed on a flat surface where they receive photo processing to place circuit configurations on a top surface of the wafer. In contrast, the ball 700 receives photo processing across almost its entire surface. As a result, a larger surface area is available to receive the circuit configurations. For example, considering three structures: a square device, a round disk device, and a spherical device, each having a same radius "r" it is readily apparent that the surface area of each device is defined as $4r^2$, $\pi r^2$, and $4\pi r^2$, respectively. Therefore, the spherical device has the greatest surface area available to support the circuit configurations.

There are several methods for performing photo exposure onto the ball 700, including a fixed-type, a reflecting-type, a descending-type and an ascending-type exposure system.

Figure 13:
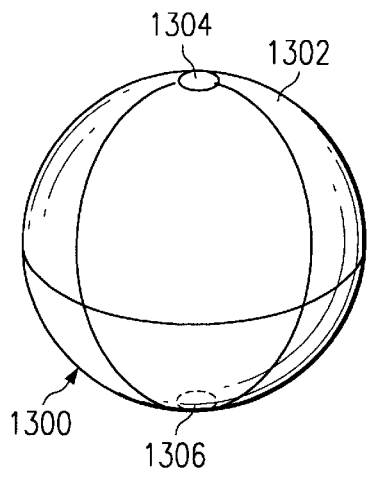
FIG. 13 illustrates a spherical surface mask for use in photo exposure processing.

Referring to FIG. 13, some photo exposure methods utilize a spherical shaped mask 1300. The mask 1300 includes a transparent spherical surface 1302 having a top opening 1304 and a bottom opening 1306. Once a layout drawing of the circuit configuration (not shown) has been prepared, using conventional layout techniques although slightly modified to support the spherical surface 1302, the layout drawings are applied to the spherical surface using conventional techniques such as electron beam, x-ray, spherical surface plotter, or laser beam. The layout drawings may be applied to either the inside or outside of the surface 1302, and the surface may also be cut in half to facilitate such application.

Figure 14:
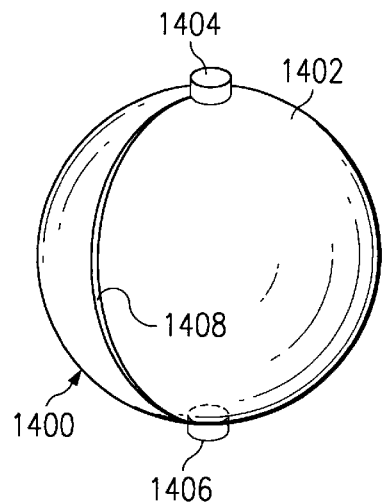
FIG. 14 illustrates a spherical slit drum for use in photo exposure processing.

Referring to FIG. 14, some photo exposure methods also utilize a slit drum 1400. The slit drum 1400 includes an opaque spherical surface 1402 having a top opening 1404, a bottom opening 1406, and a slit opening 1408.

Figure 15:
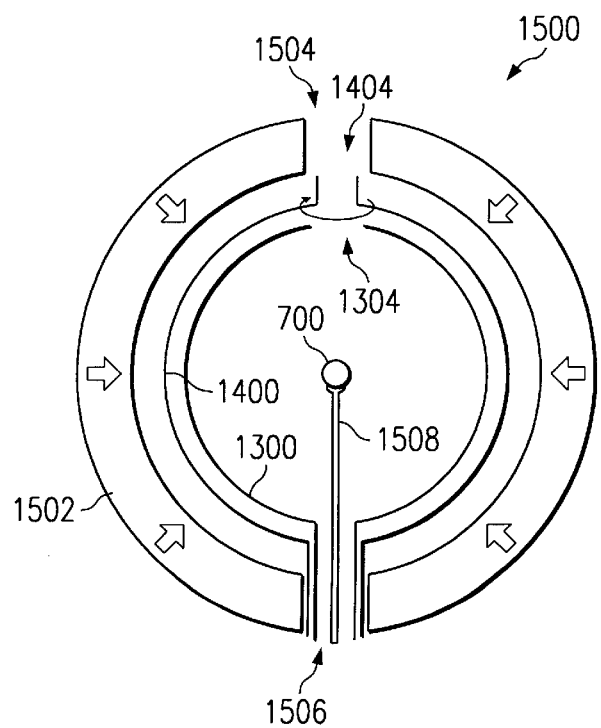
FIG. 15 illustrates a fixed-type photo exposure system.

Referring to FIGS. 13–15, a fixed-type exposure system 1500 performs photo exposure onto the ball 700. The exposure system 1500 fixes the mask 1300 in a stationary position. Surrounding the mask 1300 is the slit drum 1400 and surrounding the slit drum is a light system 1502. The light system 1502 is capable of projecting light across the entire slit drum 1400. The light system 1502 includes a top opening 1504 which aligns with the top openings 1304, 1404 of the mask and drum, respectively, and a bottom opening 1506 which aligns with the bottom openings 1306, 1406 of the mask and drum, respectively. The ball 700 is positioned at the center of the mask 1300 by a support stand 1508.

In operation, the light system 1502 radiates light through the slit opening 1408, through a corresponding portion of the mask 1300, and onto a corresponding portion of the ball 700. The masked light then reacts with photo-resist on the ball 700 to form the desired circuit configurations. The slit drum 1400 then rotates, thereby exposing the entire surface of the ball 700 to the mask 1300. Alternatively, the slit drum 1400 may be located inside the mask 1300, or may not be used at all.

Figure 16:
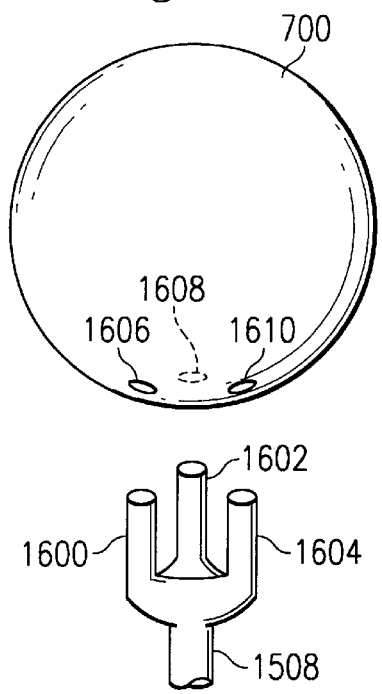
FIG. 16 illustrates a ball with alignment marks used in photo exposure processing.

Referring also to FIG. 16, the support stand 1508 has three support prongs 1600, 1602, 1604. The support prongs 1600, 1602, 1604 meet with alignment marks 1606, 1608, 1610, respectively, on the ball 700. The alignment marks 1606, 1608, 1610 are not equally spaced apart so that only one configuration of the ball 700 allows the marks to correctly join with the support prongs 1600, 1602, 1604. As a result, the ball 700 can be placed in a predetermined position for photo processing.

The alignment marks 1606, 1608, 1610 can be made a number of ways. For one, the alignment marks 1606, 1608, 1610 can be formed as indentations by a separate process (not shown). For another, the alignment marks 1606, 1608, 1610 can be randomly selected for the first photo processing operation since initially it may be unimportant as to the location of the alignment marks. The first photo processing operation will then define the alignment marks for subsequent operations.

Once the support prongs 1600, 1602, 1604 contact with the alignment marks 1606, 1608, 1610, respectively, the weight of the ball 700 secures the ball to the prongs. In addition, the support prongs 1600, 1602, 1604 may be further secured with the alignment marks 1606, 1608, 1610 by vacuum suction. In either case, the support stand 1508 is used to place the ball at the central point of the mask 1300 during processing. Although not shown, the support stand 1508 can also support the ball 700 while it is being coated with photo resist.

Figure 17:
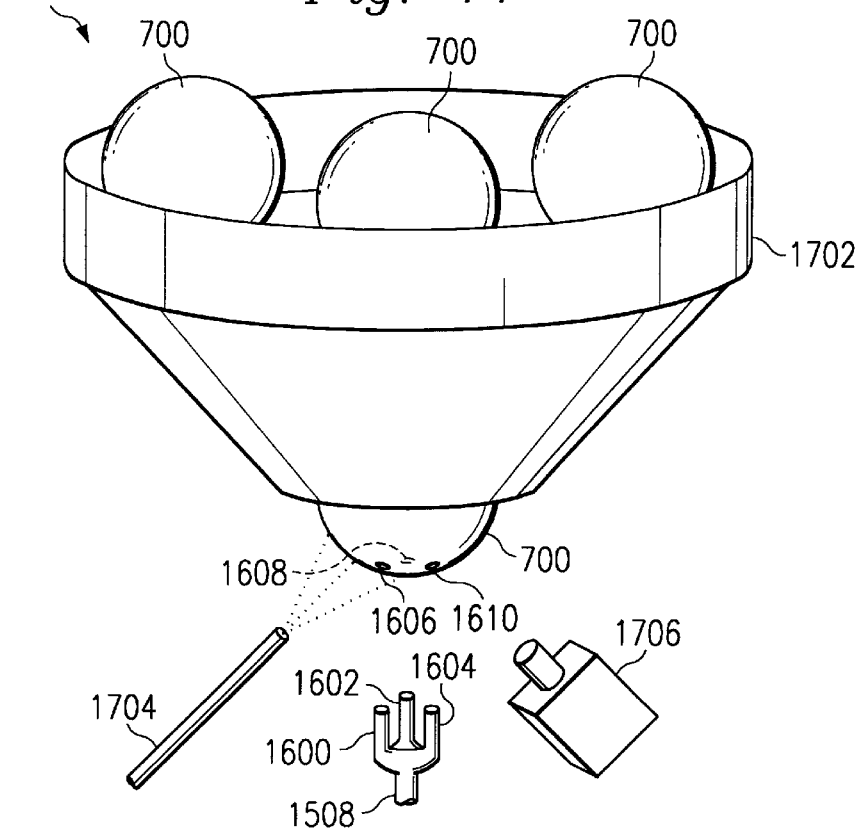
FIG. 17 illustrates a first mounting system for used with the first fixed-type photo exposure system of FIG. 15.

Referring to FIG. 17, the reference numeral 1700 designates a system for placing the ball 700 onto the support stand 1508. One or more balls 700 are first placed in a vibration chamber 1702. The vibration chamber 1702, uses an air pipe 1704 to vibrate and rotate one of the balls 700 until the alignment marks 1606, 1608, 1610 are in a position to join with the support prongs 1600, 1602, 1604. Such determination can be made by a camera 1706. Once the alignment marks 1606, 1608, 1610 are in position, the support stand 1508 moves to join the support prongs with the alignment marks. The stand 1508 then carries the ball 700 to the fixed-type exposure system 1500.

Referring to FIG. 18, the reference numeral 1800 designates another system used for placing the ball 700 onto the support stand 1508. The placement system 1800 includes two pivotal arm systems 1802, 1804, two conveyor systems 1806, 1808, a photo alignment system 1810, and a computing device 1812.

Referring also to FIG. 19, in operation, the ball 700 enters the placement system 1800 on the conveyor 1806. The conveyor 1806 has several rubber cups 1900 on which the ball 700 may ride. In addition, the rubber cups 1900 have several vacuum ports 1902 to secure the ball 700 thereto.

Referring also to FIG. 20, the first pivotal arm 1802 removes the ball 700 from the conveyor 1806. The first pivotal arm 1802 contains a controllable positioning system 2000, a vertical arm 2002, a horizontal arm 2004, and a positioner 2006. The positioning system 2000 is controlled by the computer 1812, as discussed in greater detail below. The positioning system 2000 rotates the vertical arm 2002 about a longitudinal axis 2008 as well as raises and lowers the vertical arm in a horizontal direction 2010. The horizontal arm 2004 is fixed to the vertical arm 2002. Both arms 2002, 2004 include vacuum and control lines for use by the positioner 2006. The positioner can move in many different directions 2012, and includes a vacuum cup 2014 for selectively engaging and disengaging with the ball 700.

Referring also to FIG. 18, the computer 1812 instructs the first pivotal arm 1802 to remove the ball 700 from the conveyor 1806 and place it in front of the photo alignment system 1810. The photo alignment system 1810 communicates with the computer 1812 to find the alignment marks 1606, 1608, 1610 (FIG. 16). The computer 1812 then adjusts the position of the ball 700 by manipulating the first positioner 2006 to a desired position. If the desired position is attained, as determined by the photo alignment system 1810, the first pivotal arm 1802 rotates to place the ball 700 to be accessed by the second pivotal arm 1804. If the desired position can not be attained, the first pivotal arm 1802 rotates to place the ball 700 on the second conveyor 1808. The second conveyor 1808 then returns the ball 700 to the first conveyor 1806.

Referring to FIGS. 18 and 21, the support stand 1508 is placed in and controlled by a pneumatic device 2100 of the second pivotal arm 1804. The pneumatic device 2100, which is used to raise and lower the support stand 1508, is also attached to a gear system 2102, all of which are controlled by the computer 1812. The second pivotal arm 1804 rotates about a longitudinal axis 2104 to place the ball in one of three positions P1, P2, P3. In position P1, the pneumatic device 2100 raises the support stand to engage with the ball 700 at the appropriate alignment marks: The pneumatic device 2100 then lowers the support stand 1508. In position P2, the pneumatic device 2100 is in position for the photo system 1500. The pneumatic device 2100 then raises the support stand 1508 to position the ball 700 for photo processing, as described above. Once complete, the support stand 1508 lowers, the second pivotal arm 1804 rotates to the position P3, and the gear system 2102 causes the ball 700 to be off-loaded for the next process step.

Figure 22:
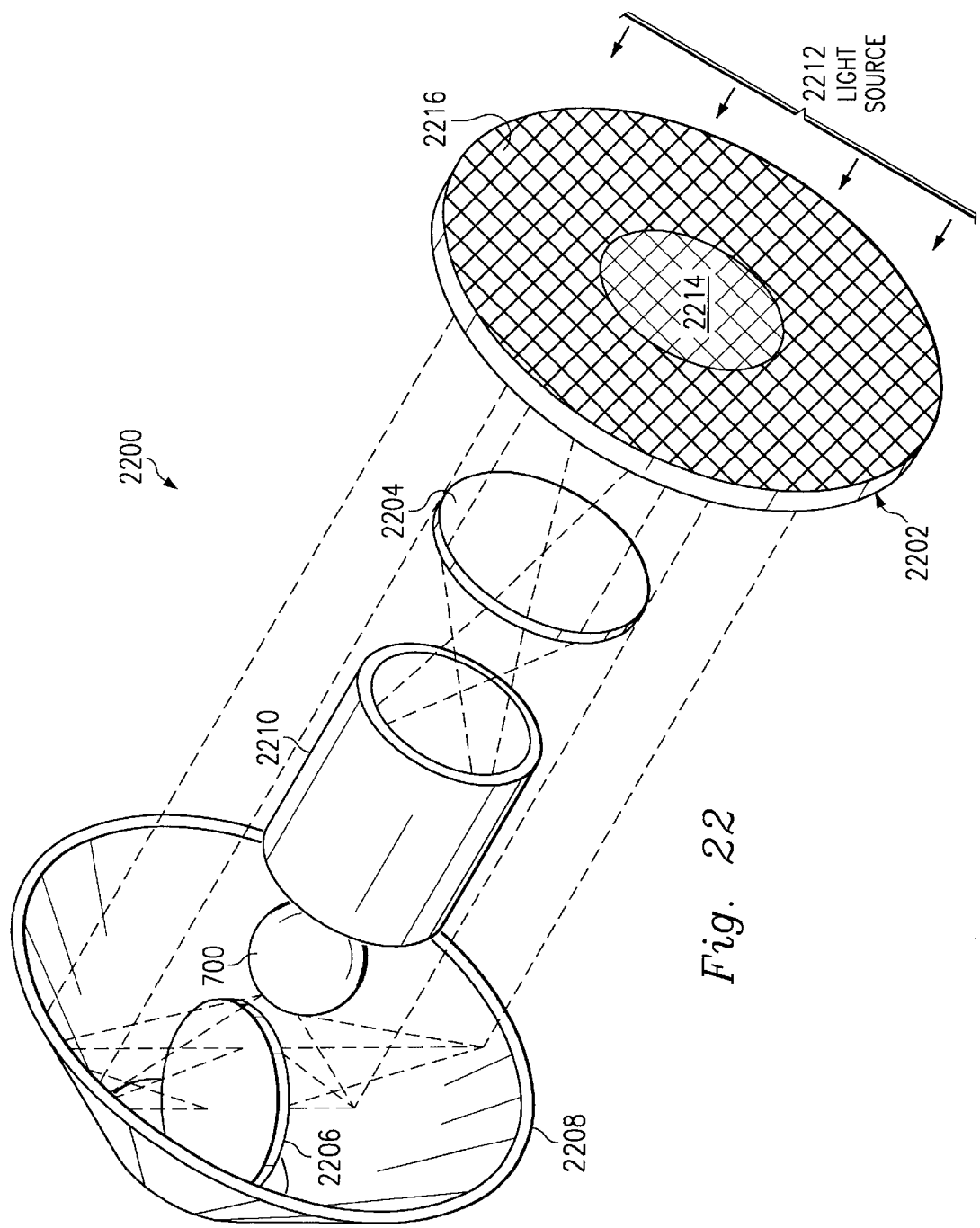
FIG. 22 illustrates a reflecting-type photo exposure system.

Referring to FIG. 22, alternatively, a reflecting-type exposure system 2200 may perform photo exposure onto the ball 700. The reflecting-type exposure system uses a flat mask 2202, two lenses 2204, 2206, and two mirrors 2208, 2210. In operation, a light source 2212 emits light through the flat, quartz reticle, mask 2202. A circuit drawn on the mask 2202 is then projected toward the ball 700. A first portion 2214 of the circuit is projected through the lenses 2204, reflected off the mirror 2210 and onto one face of the ball 700. A second portion 2216 of the circuit drawing is reflected off the mirror 2208, projected through the lenses 2206, and onto a second portion of the ball 700. As a result, a spherical circuit can be produced from a flat mask 2202.

Figure 23:
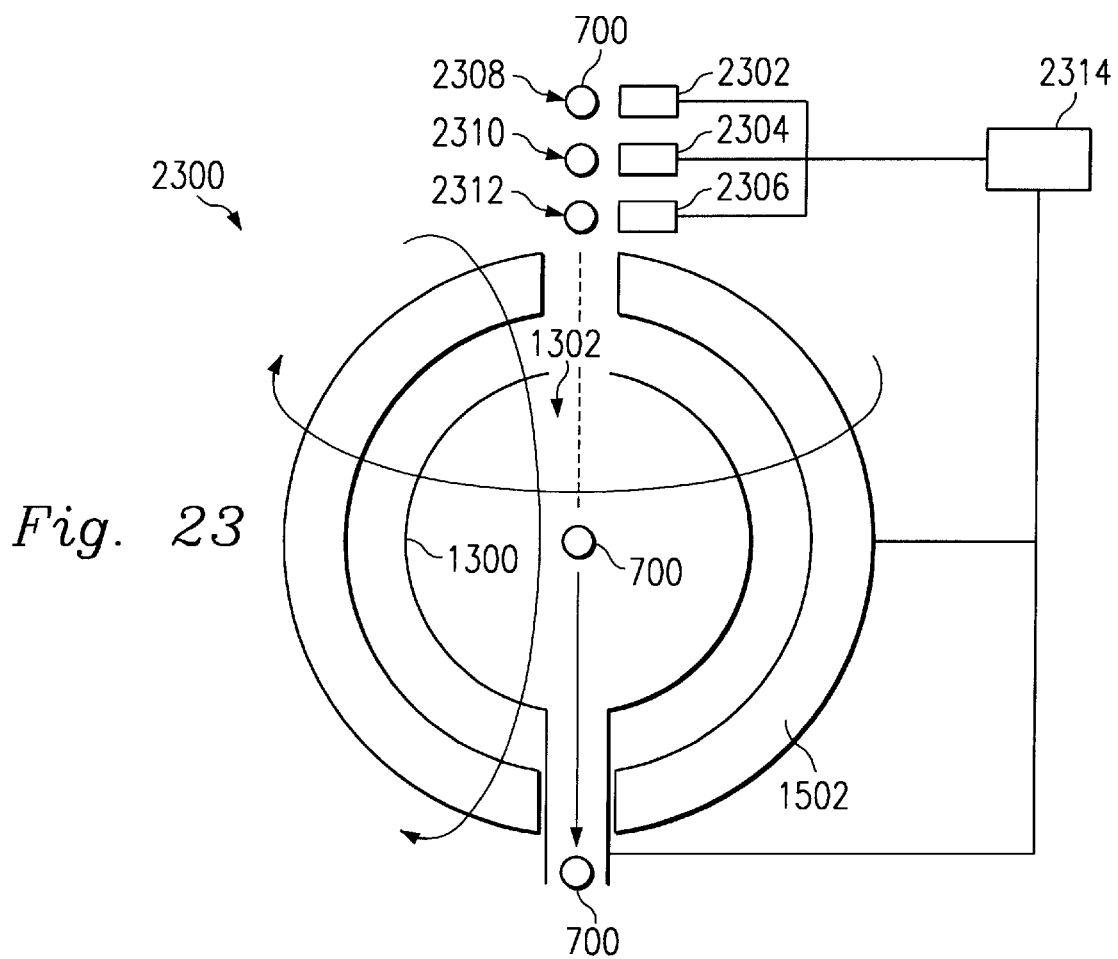
FIG. 23 illustrates a descending-type photo exposure system.

Referring to FIGS. 13 and 23, in another alternative embodiment, a descending-type exposure system 2300 may perform photo exposure onto the ball 700. The descending-type exposure system 2300 requires the three alignment marks 1606, 1608, 1610 (FIG. 16), but does not affix the ball onto the support stand 1508. In addition, the descending-type exposure system 2300 does not use the slit drum 1400 (FIG. 14). Instead, the descending-type exposure system 2300 includes several high speed, high resolution cameras such as cameras 2302, 2304, 2306 located above the opening 1304 of the mask 1300. As the ball 700 falls past points 2308, 2310, 2312, the cameras 2302, 2304, 2306 report the position of the ball 700, and its orientation, to a computing device 2314. The computing device then. predicts when the ball 700 will reach the central point of the mask 1300 and activates the photo system 1502 at the exact right time. In addition, the computing device 2314 also instructs a positioning device (not shown) to rotate and move the mask 1300 to accommodate the orientation of the ball 700.

Although not shown, additional embodiments are inherent from the above mentioned embodiments. For example, an ascending-type exposure system is similar to the descending-type except that a forced gas causes the ball 700 to move upward past several lower-mounted cameras, to the central point of the mask 1300, and out the opening 1304. In addition, a second fixed-type exposure system behaves similarly to the exposure system of FIG. 15 except that the support stand 1508, utilizing vacuum suction, enters the mask 1300 from the top opening 1304 for exposure, and then releases it to exit through the bottom opening 1306.

H. COATING AND LEADS

Figure 24:
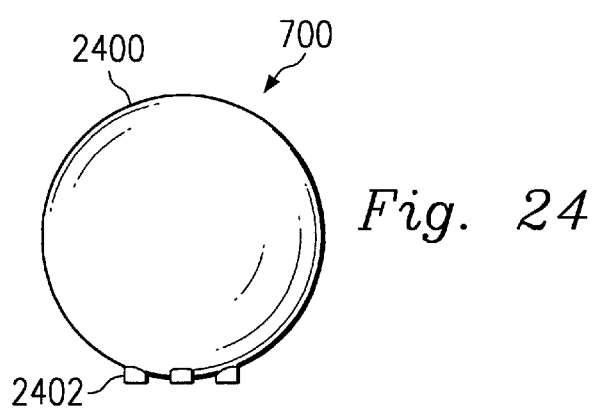
FIG. 24 illustrates a finished version of the ball.

Referring to FIG. 24, the ball 700 is coated with a protective paint 2500. The paint 2500 is also colored for the purpose of product distinction. Once the paint 2500 has been applied, leads 2502 are added to the ball 700. The leads can be applied by removing the colored paint 2500 from pads (not shown) on the ball, or the pads can be protected during the paint process to prevent any paint from being applied thereto. Solder balls, or reflow solder, are then physically and electrically attached to the pads. The solder balls serve as leads for connecting the ball to other devices, as discussed in greater detail below.

III. Clustering One or More Balls

Figure 25:
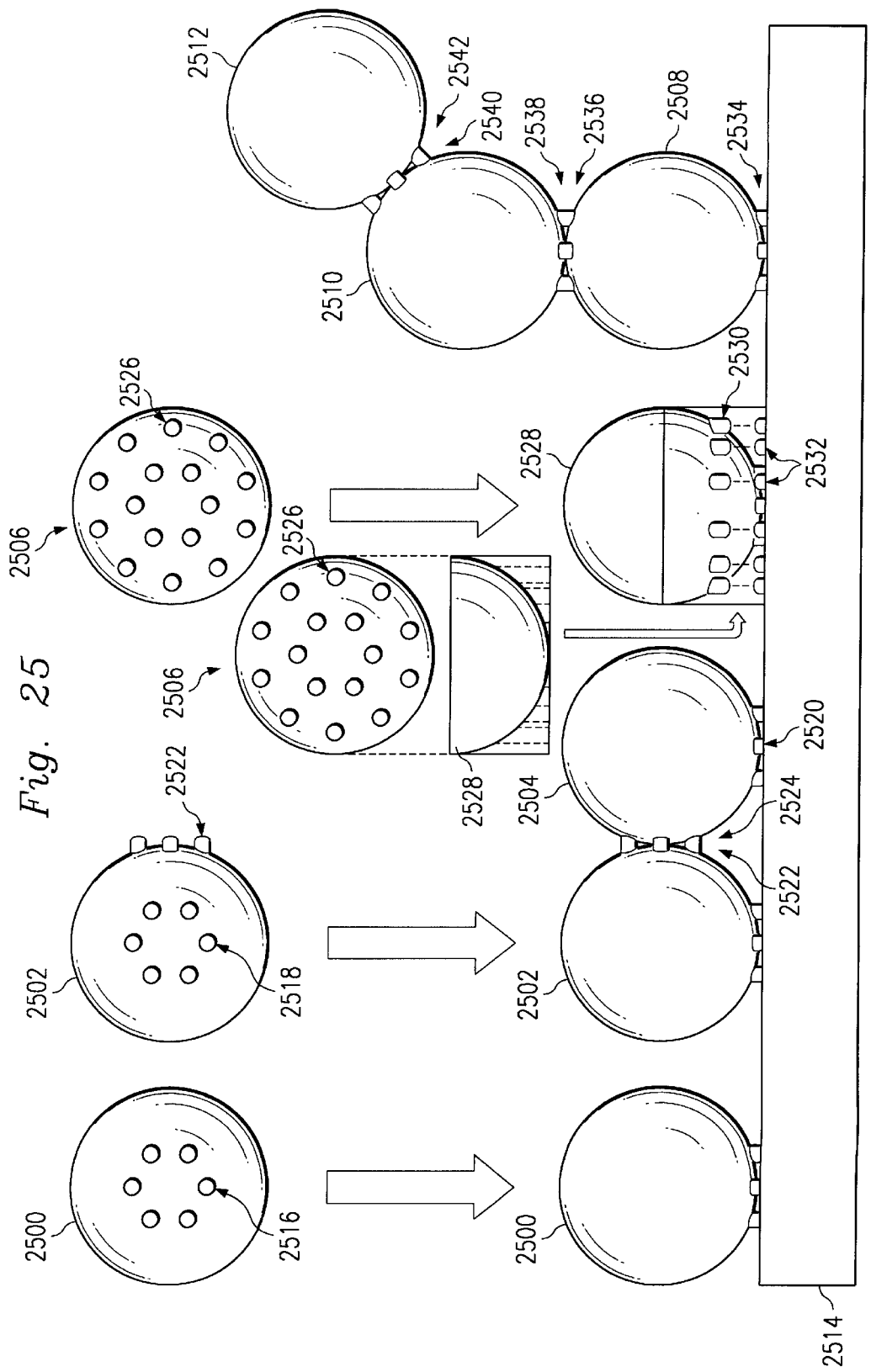
FIG. 25 illustrates many balls mounted to a circuit board.

Referring to FIG. 25, several different balls 2500, 2502, 2504, 2506, 2508, 2510, 2512 are shown. As a finished product, the balls 2500–2512 have solder bumps arranged at predefined intervals throughout their surface. As a result, the balls 2500–2508 can be easily mounted to a circuit board 2514, a bottom portion of each ball resting directly on the circuit board. The ball 2500 has solder bumps 2516 arranged in a relatively small circle so that the ball 2500 can be mounted to the flat circuit board 2514. The balls 2502, 2504 each have a first set of solder bumps 2518, 2520, respectively, for mounting to the circuit board 2514 and a second set of solder bumps 2522, 2524 respectively for connecting to each other. The ball 2506 has many solder bumps 2526. To electrically connect each solder bump 2526 to the circuit board 2514, the ball 2506 is placed into a socket 2528. The socket 2528 has pads 2530 that align with the solder bumps 2526 and electrical connections 2532 on a bottom surface for connecting the pads to the circuit board 2514. The ball 2508 has solder bumps 2534, 2536; the ball 2510 has solder bumps 2538, 2540; and the ball 2512 has solder bumps 2542 so that the balls may connect to the board and to each other, as shown.

Figure 26:
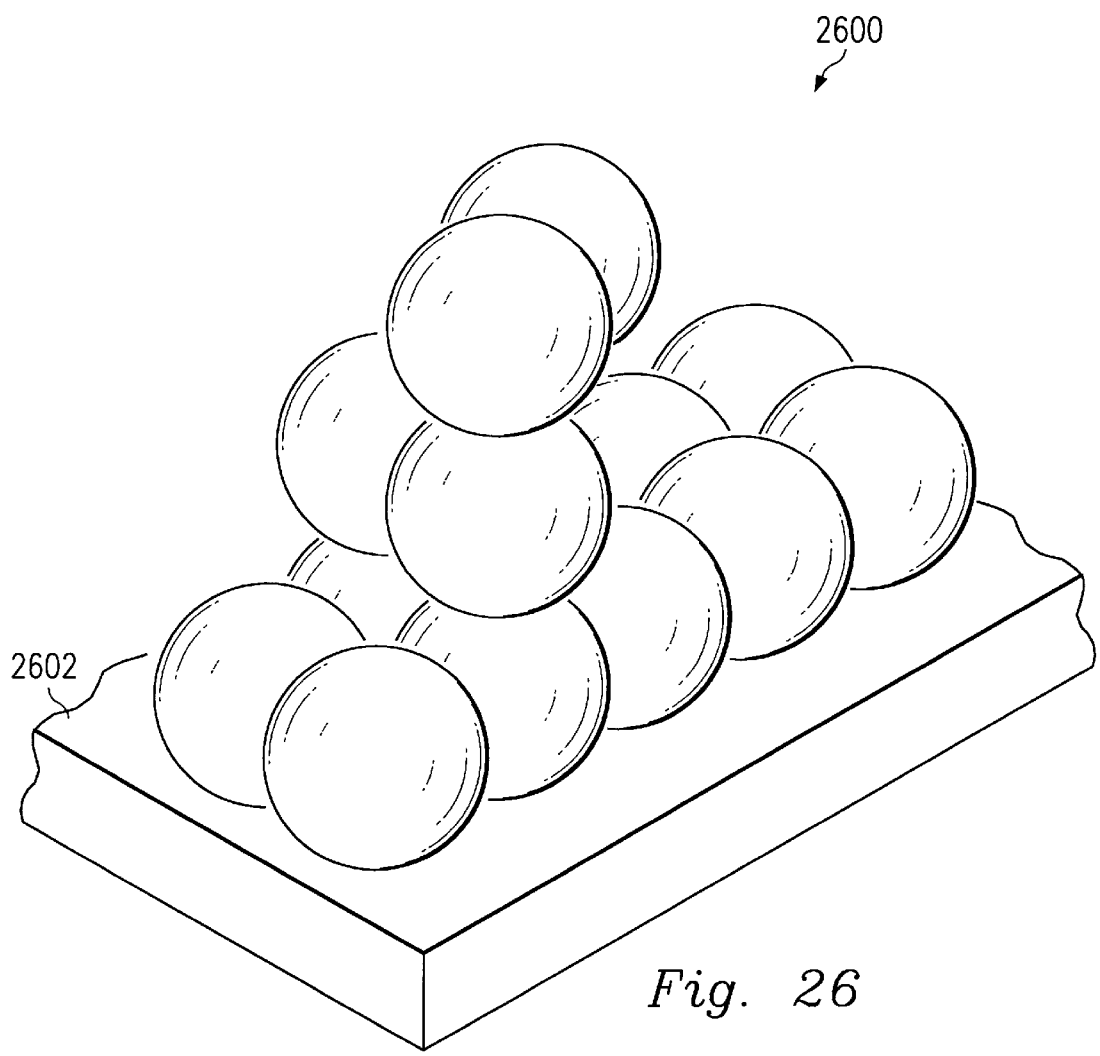
FIG. 26 illustrates a VLSI circuit made by clustering several balls.

Referring to FIG. 26, multiple balls, designated generally by referenced numeral 2600, are clustered together and to a circuit board 2602. Several advantages are obtained from the clustering. By clustering the balls 2600 in different directions based on structural designing, they form a very large scale integrated ("VLSI") circuit which may be assembled onto very complicated surfaces. For example, the VLSI circuit 2600 may be constructed inside a pipe or on an uneven surface. In addition, the distance between the balls is greatly reduced, thereby enhancing the overall operation of the VLSI circuit 2600.

IV. Discrete Components

By using a spherical single crystal as a base material for manufacturing, spherical discrete semiconductor devices can be made. Examples of such discrete semiconductor devices includes registers, capacitors, inductors, and transistors.

For example, in conventional chip manufacturing, it is impossible to add any significant inductance to the chip. Although coils can be made on the chip, very little material can be located between the coils due to the relatively flat nature of the chip. As a result, the linkage for the inductor is very low. In contrast, the ball can be manufactured to a specific inductance in several ways. For one, sample spherical inductance is made by processing metal paths, or coils, around the ball. Because the core of the ball provides a significant amount of material between the coils, the linkage for the inductor can be significant. Furthermore, additional inductors can be added by adding additional metal layers.

Utilizing such inductance, several balls can be clustered to create a semiconductor antenna for sending and receiving radio frequency signals. In addition, an inductor-resistor oscillator can be easily produced.

V. Conclusion

The above described manufacturing system provides many advantages over conventional wafer and chip manufacturing and processes in addition to those stated above.

One advantage is that the entire process is extremely clean, and suffers little product loss due to contamination. Furthermore, most of the equipment can be hermetically sealed and interconnected by using a continuous pipe or tube. As a result, no clean room is required and there is no handling of the silicon product.

Another advantage is that most of the equipment can be interconnected by using a continuous pipe or tube. The use of pipes readily facilitates efficient "pipeline productions", thereby reducing cycle time. Furthermore, individual crystal spheres are round and light, and can therefore easily float on a bed of liquids, also improving the production efficiency.

Another advantage is that no conventional packaging is required because the form is spherical and therefore no edges exist which are subject to breakage.

Another advantage is the low cost in constructing the polycrystal and single crystal when producing a spherical crystal.

Another advantage is the low cost in the diffusion, oxidation and other fabrication processes.

Another advantage is that manufacturing polycrystal and a single crystal can be extremely simplified and the yield for the single crystal is dramatically improved.

Another advantage is that the oxygen content in a single crystal is very low.

Another advantage is that there is no significant yield decrease due to warpage or varying wafer thickness as in conventional chip processing.

Another advantage is that clustering enables multi-layer metal wiring, multi-active layers, unique layout configurations for a VLSI circuit. Also, the necessity for multi-layer printed circuit board is reduced.

Another advantage is that conventional packaging activities, such as sawing, mounting, wire bonding, and molding, becomes unnecessary.

Another advantage is that compared to the area on a printed circuit board required by conventional chips, the ball requires much less area.

Another advantage is that machinery for production remains relatively small.

Although illustrative embodiments of the present invention have been shown and described, a latitude of modification, change and substitution is intended in the foregoing disclosure, and in certain instances, some features of the invention will be employed without a corresponding use of other features. For example, additional or alternative processes and other ball configurations may be added without altering the scope of the invention. Accordingly, it is appropriate that the appended claims be construed broadly and in a manner consistent with the scope of the invention.

What is claimed is:

1. A system for polishing a spherical shaped semiconductor comprising:

an outer pipe having an inside diameter;

an inner pipe coaxial with the outer pipe, the inner pipe having a first, second and third section wherein the first section has a first outside diameter, the second section has a second outside diameter greater than the first diameter, and the third section connects the first and second sections and has a third outside diameter that varies from the first diameter to the second diameter;

wherein the inside diameter of the outer pipe is less than the second outside diameter of the inner pipe;

wherein, when the inner pipe rotates about the axis, with respect to the outer pipe, the spherical shaped semiconductor is polished.

* * * * *